(12) United States Patent
Ida

(10) Patent No.: US 12,374,910 B2
(45) Date of Patent: Jul. 29, 2025

(54) CHARGING/DISCHARGING CONTROL DEVICE AND CHARGING/DISCHARGING CONTROL METHOD

(71) Applicant: Mitsubishi Electric Corporation, Tokyo (JP)

(72) Inventor: Takahito Ida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 864 days.

(21) Appl. No.: 17/613,498

(22) PCT Filed: Jul. 19, 2019

(86) PCT No.: PCT/JP2019/028511
§ 371 (c)(1),
(2) Date: Jun. 8, 2022

(87) PCT Pub. No.: WO2021/014506
PCT Pub. Date: Jan. 28, 2021

(65) Prior Publication Data
US 2022/0352736 A1 Nov. 3, 2022

(51) Int. Cl.
*H01M 10/44* (2006.01)
*G01R 31/3842* (2019.01)
(Continued)

(52) U.S. Cl.
CPC ........ *H02J 7/0047* (2013.01); *G01R 31/3842* (2019.01); *G01R 31/389* (2019.01);
(Continued)

(58) Field of Classification Search
CPC ............. G01R 31/3842; G01R 31/388; H01M 10/482; H02J 7/0013; H02J 7/00712;
(Continued)

(56) References Cited

U.S. PATENT DOCUMENTS

2005/0017684 A1* 1/2005 Brecht ............. H02J 7/007184
320/131
2009/0243548 A1 10/2009 Hoff
(Continued)

FOREIGN PATENT DOCUMENTS

JP  2015-73429 A  4/2015
JP  2018-23257 A  2/2018

OTHER PUBLICATIONS

International Search Report and Written Opinion mailed on Oct. 8, 2019, received for PCT Application PCT/JP2019/028511, Filed on Jul. 19, 2019, 8 pages including English Translation.

*Primary Examiner* — Julian D Huffman
*Assistant Examiner* — Lisa Kotowski
(74) *Attorney, Agent, or Firm* — XSENSUS LLP

(57) ABSTRACT

Provided is a charging/discharging control device which, for an assembled battery including a plurality of storage batteries connected in series, detects capacity variation among the storage batteries and controls charging/discharging of the assembled battery. The charging/discharging control device includes a charging/discharging controller which calculates an electric-charge-quantity corresponding value which is a value corresponding to an electric charge quantity of the assembled battery, on the basis of a current value of the assembled battery, and calculates, as a voltage second-order derivative value, a value obtained through second-order differentiation of open-circuit voltage of the assembled battery with respect to the electric-charge-quantity corresponding value. When a predetermined charging-stop condition is satisfied, the charging/discharging controller performs control to stop charging, and determines whether or not there is capacity variation among the plurality of storage batteries in the assembled battery, on the basis of the voltage
(Continued)

second-order derivative value when the charging-stop condition is satisfied.

15 Claims, 9 Drawing Sheets

(51) Int. Cl.
G01R 31/389 (2019.01)
H01M 10/48 (2006.01)
H02J 7/00 (2006.01)
G01R 31/388 (2019.01)

(52) U.S. Cl.
CPC ....... H01M 10/441 (2013.01); H01M 10/482 (2013.01); H02J 7/0013 (2013.01); H02J 7/00712 (2020.01); *G01R 31/388* (2019.01); *Y10S 320/21* (2013.01)

(58) Field of Classification Search
CPC ........... H02J 7/007186; H02J 7/007184; Y10S 320/21; Y02E 60/10
USPC ......................................... 320/134
See application file for complete search history.

(56) References Cited

U.S. PATENT DOCUMENTS

| | | | |
|---|---|---|---|
| 2009/0315520 A1* | 12/2009 | Nishiyama | G01R 19/16542 429/61 |
| 2018/0041052 A1 | 2/2018 | Nakamoto et al. | |
| 2019/0049524 A1* | 2/2019 | Katoh | H01M 10/0525 |

* cited by examiner

CHARGING/DISCHARGING CONTROL DEVICE AND CHARGING/DISCHARGING CONTROL METHOD

CROSS-REFERENCE TO RELATED APPLICATION

The present application is based on PCT filing PCT/JP2019/028511, filed Jul. 19, 2019, the entire contents of which are incorporated herein by reference.

TECHNICAL FIELD

The present invention relates to charging/discharging control for a lithium ion battery, and in particular, relates to a charging/discharging control device and a charging/discharging control method that can detect capacity variation among storage battery cells connected in series.

BACKGROUND ART

Conventionally, in a power storage system required to have a large capacity such as a stationary-installation type, a power storage pack or a power storage module including a plurality of storage batteries connected in series is used. In such a power storage system required to have a large capacity, lithium ion batteries which have features such as high energy density and high output density are often used. However, due to variation in manufacturing of the lithium ion batteries, variation in the temperature in the usage environment, etc., there can be capacity variation among the storage batteries connected in series. The storage batteries connected in series are charged/discharged with the same current amount. Therefore, overcharge or overdischarge might occur in the storage battery reduced in capacity.

The lithium ion battery is vulnerable to overcharge and overdischarge, and unless the lithium ion battery is used within a prescribed voltage range, the lithium ion battery might cause abnormal heat generation or internal short-circuit, thus ending up being unable to be used as a storage battery. Considering this, for example, Patent Document 1 discloses a charging/discharging control device in which a voltage sensor is attached for each storage battery cell, and finish of charging/discharging is determined on the basis of the voltage of each storage battery cell. Patent Document 2 discloses a charging/discharging control device in which the total voltage of an assembled battery is measured and if there is variation among the remaining capacities of the storage battery cells, charging is finished before reaching overcharge.

CITATION LIST

Patent Document

Patent Document 1: Japanese Laid-Open Patent Publication No. 2018-23257
Patent Document 2: Japanese Laid-Open Patent Publication No. 2015-73429

SUMMARY OF THE INVENTION

Problems to be Solved by the Invention

However, the charging/discharging device of Patent Document 1 has a problem that the storage battery structure is complicated due to attachment of voltage sensors for the respective storage battery cells. In the charging/discharging device of Patent Document 2, when there is variation among the remaining capacities of the storage battery cells, overcharge can be prevented but the storage battery reduced in capacity cannot be detected. If the storage battery reduced in capacity continues to be used, overdischarge occurs and thus might lead to internal short-circuit.

The present invention has been made to solve the above problems, and an object of the present invention is to provide a charging/discharging control device and a charging/discharging control method that, for an assembled battery including a plurality of storage batteries connected in series, can detect capacitance variation among the storage batteries without measuring the voltage of each storage battery cell, and control charging/discharging of the assembled battery.

Solution to the Problems

A charging/discharging control device according to the present invention is for controlling charging/discharging of an assembled battery including a plurality of storage batteries connected in series, and includes a charging/discharging control unit which calculates an electric-charge-quantity corresponding value which is a value corresponding to an electric charge quantity of the assembled battery, on the basis of a current value of the assembled battery, and calculates, as a voltage second-order derivative value, a value obtained through second-order differentiation of open-circuit voltage of the assembled battery with respect to the electric-charge-quantity corresponding value. When a predetermined charging-stop condition is satisfied, the charging/discharging control unit performs control to stop charging, and determines whether or not there is capacity variation among the plurality of storage batteries in the assembled battery, on the basis of the voltage second-order derivative value when the charging-stop condition is satisfied.

A charging/discharging control method according to the present invention is for controlling charging/discharging of an assembled battery including a plurality of storage batteries connected in series, and includes the steps of: measuring a voltage value of the assembled battery; measuring a current value of the assembled battery; estimating an assembled battery resistance value of the assembled battery from change in the voltage value with respect to change in the current value; calculating an electric-charge-quantity corresponding value which is a value corresponding to an electric charge quantity of the assembled battery, from the current value; calculating, as a voltage second-order derivative value, a value obtained through second-order differentiation of open-circuit voltage of the assembled battery with respect to the electric-charge-quantity corresponding value; and when a predetermined charging-stop condition is satisfied, performing control to stop charging, and determining whether or not there is capacity variation among the plurality of storage batteries in the assembled battery, on the basis of the voltage second-order derivative value when the charging-stop condition is satisfied.

Effect of the Invention

The charging/discharging control device and charging/discharging control method according to the present invention can detect capacity variation among the storage battery cells connected in series. Thus, the storage battery cell reduced in capacity can be prevented from continuing to be used in an overcharge or overdischarge state.

DESCRIPTION OF EMBODIMENTS

Figure 1:
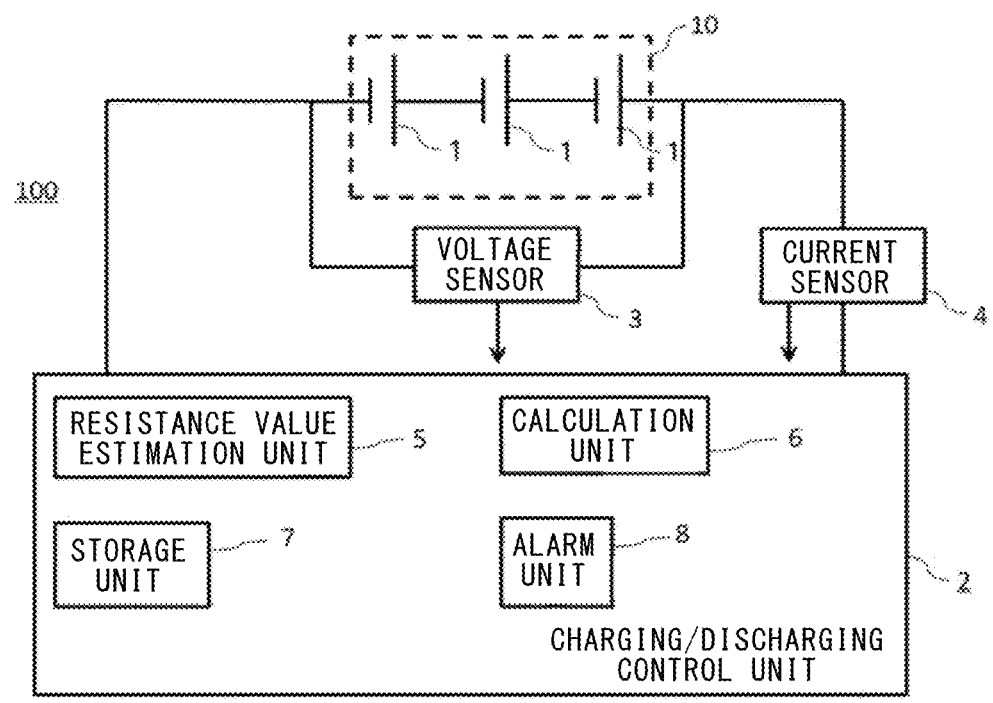
FIG. 1 is a diagram illustrating the configuration of a charging/discharging control device according to embodiment 1 of the present invention.

Hereinafter, a charging/discharging control device and a charging/discharging control method according to embodiments of the present invention will be described with reference to the drawings. In the following embodiments, the same components are denoted by the same reference characters.

Embodiment 1

FIG. 1 is a configuration diagram of a charging/discharging control device according to embodiment 1 of the present invention. A charging/discharging control device 100 controls charging/discharging of an assembled battery 10 including a plurality of storage batteries 1 connected in series. As used herein, the storage battery 1 refers to a lithium ion battery, and more specifically, a lithium ion battery using lithium iron phosphate as a main component of a positive electrode or using lithium titanate as a main component of a negative electrode.

The charging/discharging control device 100 includes a charging/discharging control unit 2, a voltage sensor 3 connected in parallel to the assembled battery 10, and a current sensor 4 connected in series to the assembled battery 10. The voltage sensor 3 measures a voltage value V of the assembled battery 10, and the current sensor 4 measures a current value I of current flowing through the assembled battery 10. The measured voltage value V and current value I are outputted to the charging/discharging control unit 2.

The charging/discharging control unit 2 includes a resistance value estimation unit 5, a calculation unit 6, and a storage unit 7. The charging/discharging control unit 2 controls operations of the respective units and detects capacity variation among the storage batteries 1 in accordance with an external command, the voltage value V and the current value I of the assembled battery 10, and a calculation result based on the voltage value V and the current value I, thereby performing charging/discharging control of the assembled battery 10. In addition, an alarm unit 8 is provided for issuing an alarm to the outside when capacity variation is detected, as necessary.

The resistance value estimation unit 5 estimates an assembled battery resistance value R from the voltage value V and the current value I of the assembled battery 10.

The calculation unit 6 estimates open-circuit voltage OCV from the voltage value V, the current value I, and the assembled battery resistance value R of the assembled battery 10, and then, from the open-circuit voltage OCV and the current value I, calculates a value obtained through second-order differentiation of the open-circuit voltage OCV with respect to an electric charge quantity Q, and the like. Here, the electric charge quantity Q represents the quantity of electric charge as an electric-charge-quantity corresponding value, and is obtained by integrating the current value I with respect to time. The electric charge quantity Q is an example of the "electric-charge-quantity corresponding value". As the electric-charge-quantity corresponding value, the remaining capacity, i.e., the state of charge (SOC) may be used instead of the electric charge quantity Q. The state of charge (SOC) is a value obtained by dividing the electric charge quantity by the full-charge capacity of the storage battery.

The storage unit 7 stores the voltage value V, the current value I, the resistance value R, the open-circuit voltage OCV, the value obtained through second-order differentiation of the open-circuit voltage OCV with respect to the electric charge quantity Q, preset thresholds (described later), and the like.

The charging/discharging control unit 2 determines whether or not there is capacity variation among the storage battery cells from the above calculation results and the stored values, and performs charging/discharging control for the assembled battery 10.

Figure 2:
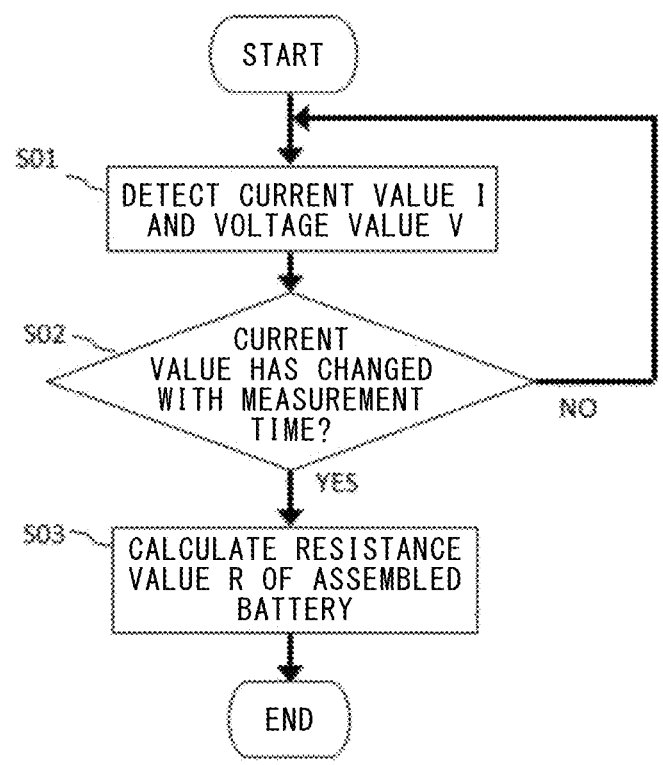
FIG. 2 is an operation flowchart of a resistance value estimation unit according to embodiment 1 of the present invention.

FIG. 2 is a resistance value calculation flowchart showing operation of the resistance value estimation unit 5 in the charging/discharging control device 100 according to embodiment 1 of the present invention. Hereinafter, the flowchart in FIG. 2 will be described.

In FIG. 2, when operation of the resistance value estimation unit 5 is started, in step S01, the current sensor 4 connected in series to the assembled battery 10 measures the current value I of current flowing through the assembled battery 10, and the voltage sensor 3 connected in parallel to the assembled battery 10 measures the voltage value V of the assembled battery 10. The current value I and the voltage value V are outputted to the charging/discharging control unit 2 and then stored in the storage unit 7.

In the next step S02, whether or not there is change in the current value I measured by the current sensor 4 is determined. Whether or not there is change in the current value I refers to whether or not there is change between the current values I measured by the current sensor at the previous and later times during a charging/discharging process, for example. If the current value I has not changed, the process returns to the first step S01. If the current value I has changed, the process proceeds to step S03.

In step S03, the resistance value estimation unit 5 calculates the assembled battery resistance value R of the assembled battery 10 from change in the voltage value V with respect to change in the current value I of current flowing through the assembled battery 10. The assembled battery resistance value R is calculated using the following Expression (1).

[Mathematical 1]

$$R = (V_2 - V_1)/(I_2 - I_1) \quad (1)$$

Here, $I_1$ is the current value before the current value changes, $I_2$ is the current value after the current value has changed, $V_1$ is the voltage value before the current value changes, and $V_2$ is the voltage value after the current value has changed. The calculated assembled battery resistance value R is stored in the storage unit 7.

Expression (1) is an example of a calculation method for the assembled battery resistance value. Another known estimation method for the resistance value may be used.

The resistance value calculation flowchart shown in FIG. 2 is performed at a desired timing such as the start or the end of discharging. Since the resistance value of the storage battery 1 might change during usage, the assembled battery resistance value R is calculated at certain intervals, to update the value stored in the storage unit 7.

Figure 3:
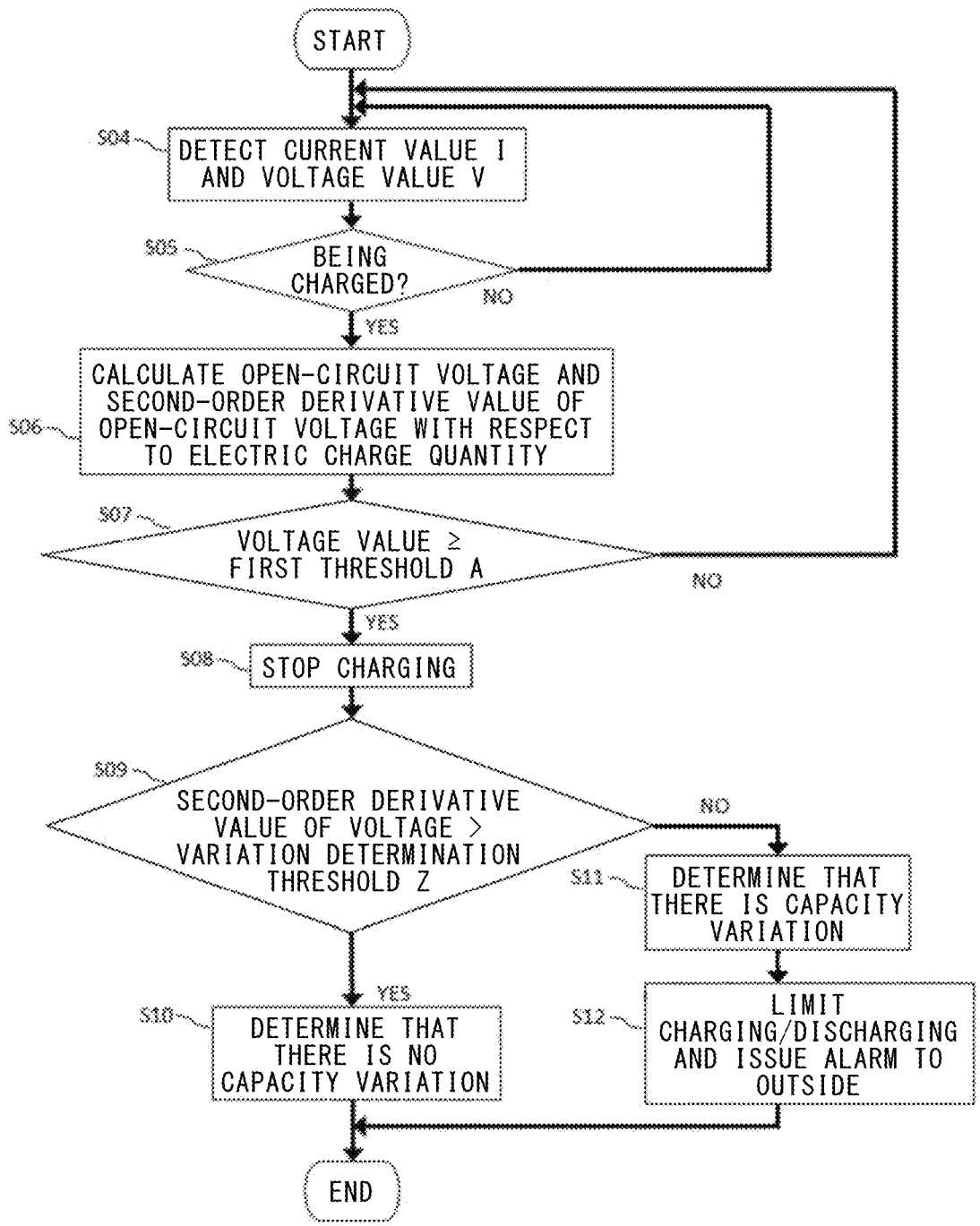
FIG. 3 is a control flowchart of the charging/discharging control device according to embodiment 1 of the present invention.

FIG. 3 is a capacity variation determination flowchart of the charging/discharging control device according to embodiment 1 of the present invention. This flowchart is repeatedly executed at certain time intervals during operation of the charging/discharging control unit 2, to detect capacity variation among the storage battery cells. Hereinafter, the flowchart in FIG. 3 will be described.

In FIG. 3, when operation of the charging/discharging control unit 2 is started, in step S04, the current sensor 4 connected in series to the assembled battery 10 measures the current value I of current flowing through the assembled battery 10, and the voltage sensor 3 connected in parallel to the assembled battery 10 measures the voltage value V of the assembled battery 10. The measured current value I and voltage value V are outputted to the charging/discharging control unit 2 and then stored in the storage unit 7.

In step S05, the charging/discharging control unit 2 determines whether or not the assembled battery 10 is being charged, on the basis of the measurement result of the current sensor 4. For example, if the current value I in the charging direction is detected, it is determined that charging is being performed. If it is determined that the assembled battery 10 is not being charged, the process returns to the first step S04. If it is determined that the assembled battery 10 is being charged, the process proceeds to step S06.

In step S06, the calculation unit 6 calculates the open-circuit voltage OCV of the assembled battery 10, using Expression (2) in which a value obtained by multiplying the current value I measured by the current sensor 4 by the assembled battery resistance value R estimated by the resistance value estimation unit 5 is subtracted from the voltage value V of the assembled battery 10 measured by the voltage sensor 3.

[Mathematical 2]

$$OCV = V - (I \times R) \quad (2)$$

Through calculation of the open-circuit voltage OCV by Expression (2), even when the current value I has changed during charging, error is corrected by subtraction of a product of the current value I and the assembled battery resistance value R, whereby the open-circuit voltage OCV of the assembled battery 10 can be accurately calculated.

In addition, the calculation unit 6 performs second-order differentiation of the open-circuit voltage OCV with respect to the electric charge quantity Q as the electric-charge-quantity corresponding value by Expression (3), to calculate a voltage second-order derivative value.

[Mathematical 3]

$$\text{Voltage second-order derivative value} = \frac{d^2(OCV)}{dQ^2} \quad (3)$$

The storage unit 7 stores the open-circuit voltage PGP-21E OCV and the voltage second-order derivative value. In the calculation unit 6, measurement error included in the measured values may be corrected using a low-pass filter or the like.

In the next step S07, the charging/discharging control unit 2 compares the voltage V of the assembled battery 10 with a first threshold A, to determine whether or not the charging is completed. Here, the first threshold A is, for example, a product of N which is the number of the storage batteries 1 connected in series and full-charge voltage $V_{Oma}$ for the single storage battery, and is defined by the following Expression (4).

[Mathematical 4]

$$A = N \times V_{o\,max} \quad (4)$$

If the voltage V of the assembled battery 10 is smaller than the first threshold A, i.e., V<A is satisfied, the process returns to step S04, to continue the charging. On the other hand, when the voltage V of the assembled battery is equal to or greater than the first threshold A, a charging-stop condition is satisfied. That is, if V≥A is satisfied, the charging/discharging control unit 2 determines that the charging-stop condition is satisfied, and thus proceeds to step S08, to stop the charging.

In the next step S09, whether or not there is capacity variation among the plurality of storage batteries 1 in the assembled battery 10 is determined on the basis of the voltage second-order derivative value when the charging-stop condition is satisfied. The charging/discharging control unit 2 compares a variation determination threshold Z with the voltage second-order derivative value which is the value obtained through second-order differentiation of the open-circuit voltage OCV with respect to the electric charge quantity Q as the electric-charge-quantity corresponding value. The variation determination threshold Z is, for example, the maximum value of the value obtained through second-order differentiation of the open-circuit voltage of the single storage battery 1 with respect to the electric charge quantity as the electric-charge-quantity corresponding value. As the storage batteries 1, a plurality of storage batteries of the same type are connected in series, and therefore the maximum value of the voltage second-order derivative value is the same among the storage batteries 1.

The variation determination threshold Z may be determined by a battery designing reference or the like in manufacturing of the storage batteries and this determined value stored in the storage unit 7 may be used.

If the value obtained through second-order differentiation of the open-circuit voltage OCV with respect to the electric charge quantity Q is greater than the variation determination threshold Z, i.e., the voltage second-order derivative value>Z is satisfied, in step S10, it is determined that there is no capacity variation among the storage battery cells in the assembled battery 10, and thus the capacity variation determination flowchart is ended.

If the value obtained through second-order differentiation of the open-circuit voltage OCV with respect to the electric charge quantity Q is equal to or smaller than the variation determination threshold Z, i.e., the voltage second-order derivative value S Z is satisfied, the process proceeds to step S1l, to determine that a storage battery reduced in capacity is present in the assembled battery 10 and thus there is capacity variation among the storage battery cells.

Next, in step S12, the charging/discharging control unit 2 performs at least one of limitation of charging/discharging and alarm to the outside by the alarm unit 8. As used herein, limitation of charging/discharging refers to lowering the upper-limit voltage when charging is performed again, raising the lower-limit voltage when discharging is performed, or lowering the maximum current value when charging/discharging is performed, for example.

Figure 4:
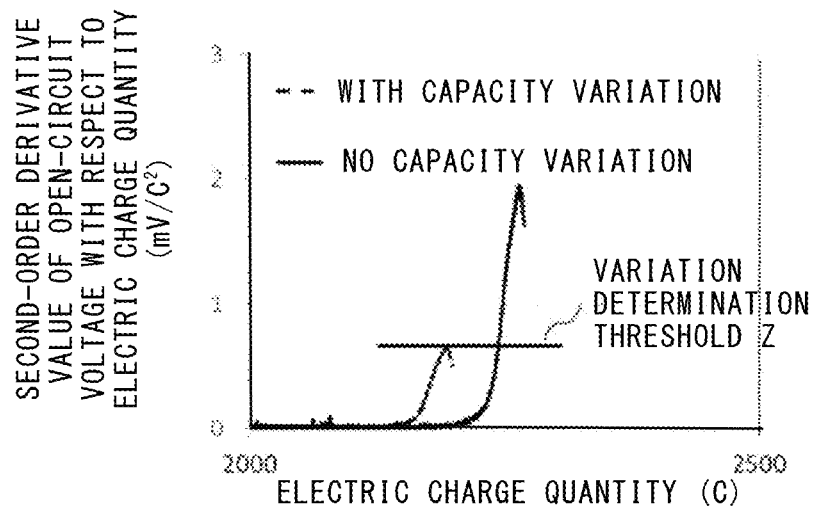
FIG. 4 is a graph showing an example of a value obtained through second-order differentiation of open-circuit voltage with respect to an electric charge quantity when an assembled battery including storage batteries connected in series is charged.

Here, the reason why capacity variation can be detected using the voltage second-order derivative value will be described with reference to FIG. 4. FIG. 4 shows an example of the value obtained through second-order differentiation of the open-circuit voltage OCV with respect to the electric charge quantity Q when the assembled battery 10 is charged. In a case where there is capacity variation among the storage batteries 1 in the assembled battery 10, only the voltage value of the storage battery 1 reduced in capacity increases. In a case where there is no capacity variation among the storage batteries 1, the voltage values of all the storage batteries 1 increase simultaneously. Therefore, in a case where there is capacity variation among the storage batteries 1, the value obtained through second-order differentiation of the open-circuit voltage OCV of the assembled battery 10 with respect to the electric charge quantity Q becomes smaller than in a case where there is no capacity variation. Thus, by appropriately setting the variation determination threshold Z, it becomes possible to determine whether or not there is capacity variation among the storage batteries 1. By performing second-order differentiation of the open-circuit voltage OCV of the assembled battery 10 with respect to the electric charge quantity Q, the slope of a curve representing the change rate of the open-circuit voltage OCV with respect to the electric charge quantity Q becomes greater than in a case of performing first-order differentiation, and thus determination accuracy for capacity variation among the storage batteries can be enhanced. That is, difference in the slope, which would be slight in the case of first-order differentiation, becomes clearer when second-order differentiation is performed, and thus determination for capacity variation is facilitated.

Figure 5:
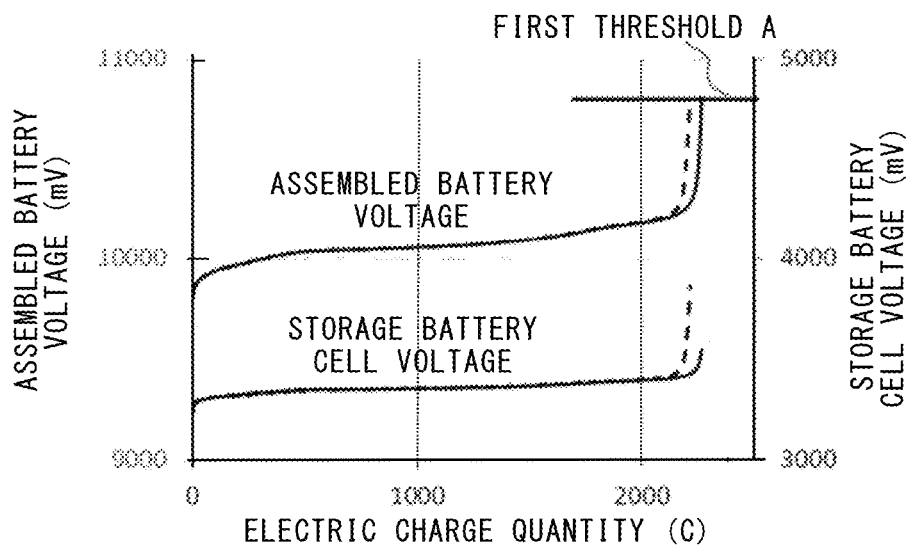
FIG. 5 is a graph showing an example of voltage changes of the assembled battery including storage batteries connected in series, and each single storage battery cell, in a case of charging.

FIG. 5 shows an example of changes in voltage values of the assembled battery and each single storage battery cell in a case of charging. It is found that, in the assembled battery having capacity variation, the storage battery cell reduced in capacity increases in voltage earlier, and therefore the storage battery cell reduced in capacity is overcharged when the voltage of the assembled battery having capacity variation has reached the initially set first threshold A. That is, in a case where there is capacity variation among the storage batteries connected in series, if charging stop determination continues to be performed with reference to the first threshold A when charging is performed again, the storage battery cell reduced in capacity might be overcharged. Therefore, when charging is performed again, limitation of charging/discharging such as updating a charging amount threshold is performed, or a measure such as issuing an alarm to prohibit reuse of the storage battery reduced in capacity is taken.

The charging/discharging control device and the charging/discharging control method according to embodiment 1 can detect capacity variation among the storage battery cells connected in series.

In addition, in a case where it is determined that there is capacity variation, at least one of limitation of charging/discharging when charging/discharging is performed again and alarm to the outside by the alarm unit 8 is performed, whereby the storage battery cell reduced in capacity can be prevented from continuing to be used in an overcharge or overdischarge state.

Embodiment 2

In embodiment 2, the same components as in embodiment 1 are denoted by the same reference characters, and description of the same or corresponding parts is omitted. The basic configuration of the charging/discharging control device according to embodiment 2 is the same as that of the charging/discharging control device according to embodiment 1 shown in FIG. 1.

Figure 6:
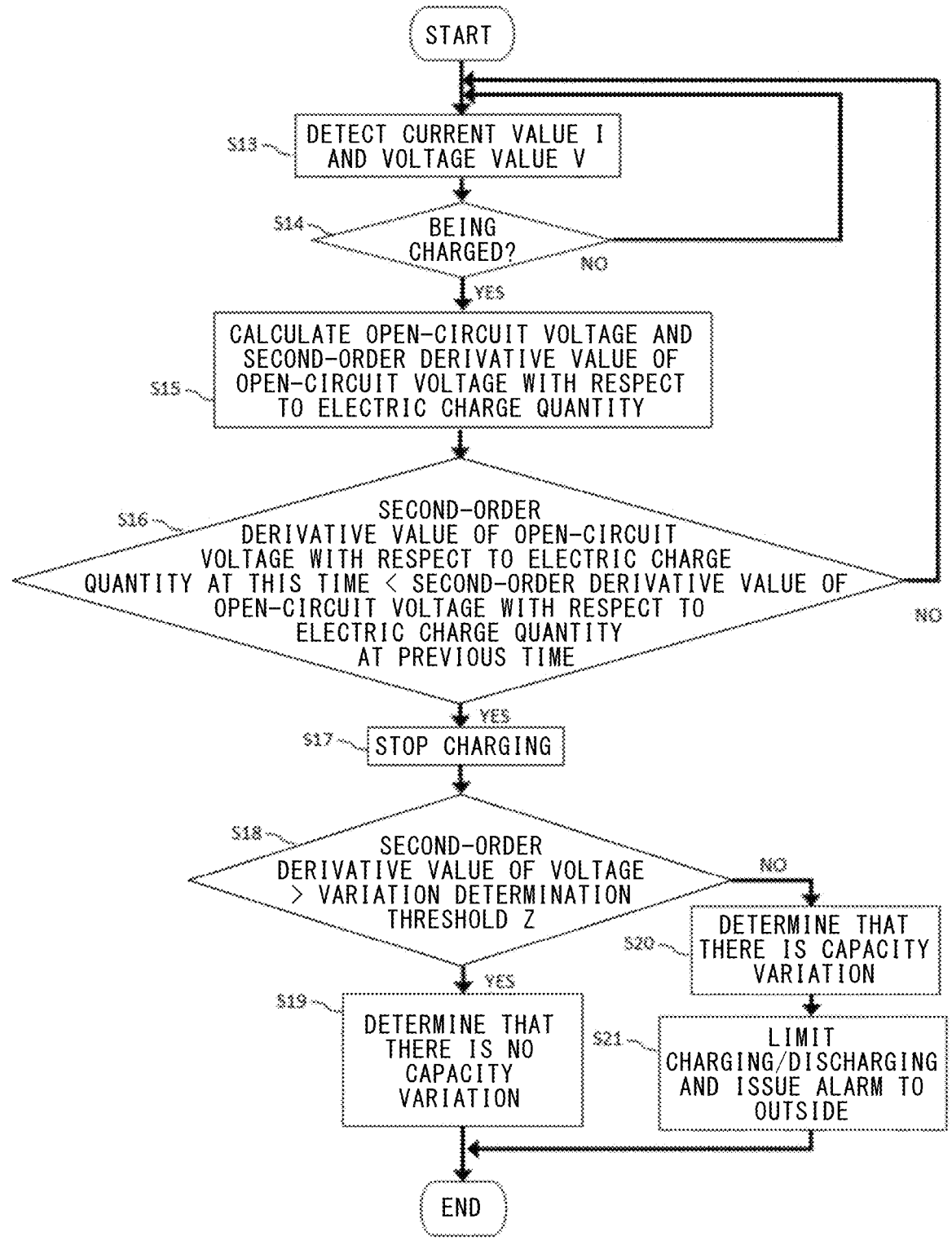
FIG. 6 is a control flowchart of a charging/discharging control device according to embodiment 2 of the present invention.

FIG. 6 is a capacity variation determination flowchart executed by the charging/discharging control device according to embodiment 2 of the present invention. This flowchart is repeatedly executed at certain time intervals during operation of the charging/discharging control unit 2, to detect capacity variation among the storage battery cells. Hereinafter, with reference to the flowchart in FIG. 6, a charging/discharging control method according to embodiment 2 will be described. It is noted that operation for calculating the assembled battery resistance value R by the resistance value estimation unit 5 is the same as in the charging/discharging control method according to embodiment 1.

In FIG. 6, when operation of the charging/discharging control unit 2 is started, in step S13, the current sensor 4 connected in series to the assembled battery 10 measures the current value I of current flowing through the assembled battery 10, and the voltage sensor 3 connected in parallel to the assembled battery 10 measures the voltage value V of the assembled battery 10. The measured current value I and voltage value V are outputted to the charging/discharging control unit 2 and then stored in the storage unit 7.

In step S14, the charging/discharging control unit 2 determines whether or not the assembled battery 10 is being charged, on the basis of the measurement result of the current sensor 4. For example, if the current value I in the charging direction is detected, it is determined that charging is being performed. If it is determined that the assembled battery 10 is not being charged, the process returns to the first step S13. If it is determined that the assembled battery 10 is being charged, the process proceeds to step S15.

In step S15, the calculation unit 6 calculates the open-circuit voltage OCV of the assembled battery, using the above Expression (2) in which a value obtained by multiplying the current value I measured by the current sensor 4 by the assembled battery resistance value R estimated by the resistance value estimation unit 5 is subtracted from the voltage value V of the assembled battery 10 measured by the voltage sensor 3.

Through calculation of the open-circuit voltage OCV by Expression (2), even when the current value I has changed during charging, error is corrected by subtraction of a product of the current value I and the assembled battery resistance value R, whereby the open-circuit voltage OCV can be accurately calculated.

In addition, the calculation unit 6 performs second-order differentiation of the open-circuit voltage OCV with respect to the electric charge quantity Q as the electric-charge-quantity corresponding value by Expression (3), to calculate a voltage second-order derivative value. Here, the electric charge quantity Q is an example of the electric-charge-quantity corresponding value. Instead of the electric charge quantity Q, the remaining capacity SOC may be used as the electric-charge-quantity corresponding value.

The storage unit 7 stores the open-circuit voltage OCV and the voltage second-order derivative value. In the calculation unit 6, measurement error included in the measured values may be corrected using a low-pass filter or the like. The process thus far is the same as the process in the capacity variation determination flowchart in embodiment 1.

In the next step S16, the charging/discharging control unit 2 uses, as a second threshold B, the voltage second-order derivative value calculated at the previous time, which is a value obtained through second-order differentiation of the open-circuit voltage calculated at the previous time with respect to the electric charge quantity, and compares the second threshold B with a value obtained through second-order differentiation of the open-circuit voltage OCV calculated at this time with respect to the electric charge quantity Q, to determine whether or not the charging is completed. That is, when change in the voltage second-order derivative value in accordance with the calculation time shifts from increase to decrease, a charging-stop condition is satisfied.

Specifically, if the value obtained through second-order differentiation of the open-circuit voltage calculated at this time with respect to the electric charge quantity is equal to or greater than the value obtained through second-order differentiation of the open-circuit voltage calculated at the previous time with respect to the electric charge quantity, the process returns to step S13, without stopping the charging. That is, if the voltage second-order derivative value calculated at this time≥the second threshold B is satisfied, the charging is continued. On the other hand, when the value obtained through second-order differentiation of the open-circuit voltage calculated at this time with respect to the electric charge quantity is smaller than the value obtained through second-order differentiation of the open-circuit voltage calculated at the previous time with respect to the electric charge quantity, the charging-stop condition is satisfied. That is, if the voltage second-order derivative value calculated at this time<the second threshold B is satisfied, the charging/discharging control unit 2 determines that the charging-stop condition is satisfied, and thus proceeds to step S17, to stop the charging.

In the next step S18, whether or not there is capacity variation among the plurality of storage batteries 1 in the assembled battery 10 is determined on the basis of the voltage second-order derivative value when the charging-stop condition is satisfied. The charging/discharging control unit 2 compares the variation determination threshold Z with the voltage second-order derivative value which is the value obtained through second-order differentiation of the open-circuit voltage OCV with respect to the electric charge quantity Q. As the variation determination threshold Z, for example, the maximum value of the value obtained through second-order differentiation of the open-circuit voltage of the single storage battery with respect to the electric charge quantity is used, as in embodiment 1. Alternatively, the variation determination threshold Z may be determined by a battery setting reference or the like in manufacturing of the storage batteries and this determined value stored in the storage device may be used.

If the value obtained through second-order differentiation of the open-circuit voltage OCV with respect to the electric charge quantity Q is greater than the variation determination threshold Z, i.e., the voltage second-order derivative value>Z is satisfied, in step S19, it is determined that there is no capacity variation among the storage battery cells in the assembled battery 10, and thus the capacity variation determination flowchart is ended.

If the value obtained through second-order differentiation of the open-circuit voltage OCV with respect to the electric charge quantity Q is equal to or smaller than the variation determination threshold Z, i.e., the voltage second-order derivative value≤Z is satisfied, the process proceeds to step S20, to determine that there is capacity variation among the storage battery cells in the assembled battery 10. Next, in step S21, the charging/discharging control unit 2 performs at least one of limitation of charging/discharging and alarm to the outside by the alarm unit 8. As used herein, limitation of charging/discharging refers to lowering the upper-limit voltage when charging is performed again, raising the lower-limit voltage when discharging is performed, or lowering the maximum current value when charging/discharging is performed, for example.

The charging/discharging control device and the charging/discharging control method according to embodiment 2 can detect capacity variation among the storage battery cells connected in series, as in embodiment 1.

In addition, even if there is capacity variation among the storage battery cells of the assembled battery, charging is stopped at the timing when change in the voltage second-order derivative value of the assembled battery shifts from increase to decrease, whereby the storage battery cell reduced in capacity can be prevented from being overcharged.

Embodiment 3

In embodiment 3, the same components as in embodiment 1 are denoted by the same reference characters, and description of the same or corresponding parts is omitted. The basic configuration of the charging/discharging control device according to embodiment 3 is the same as that of the charging/discharging control device according to embodiment 1 shown in FIG. 1.

Figure 7:
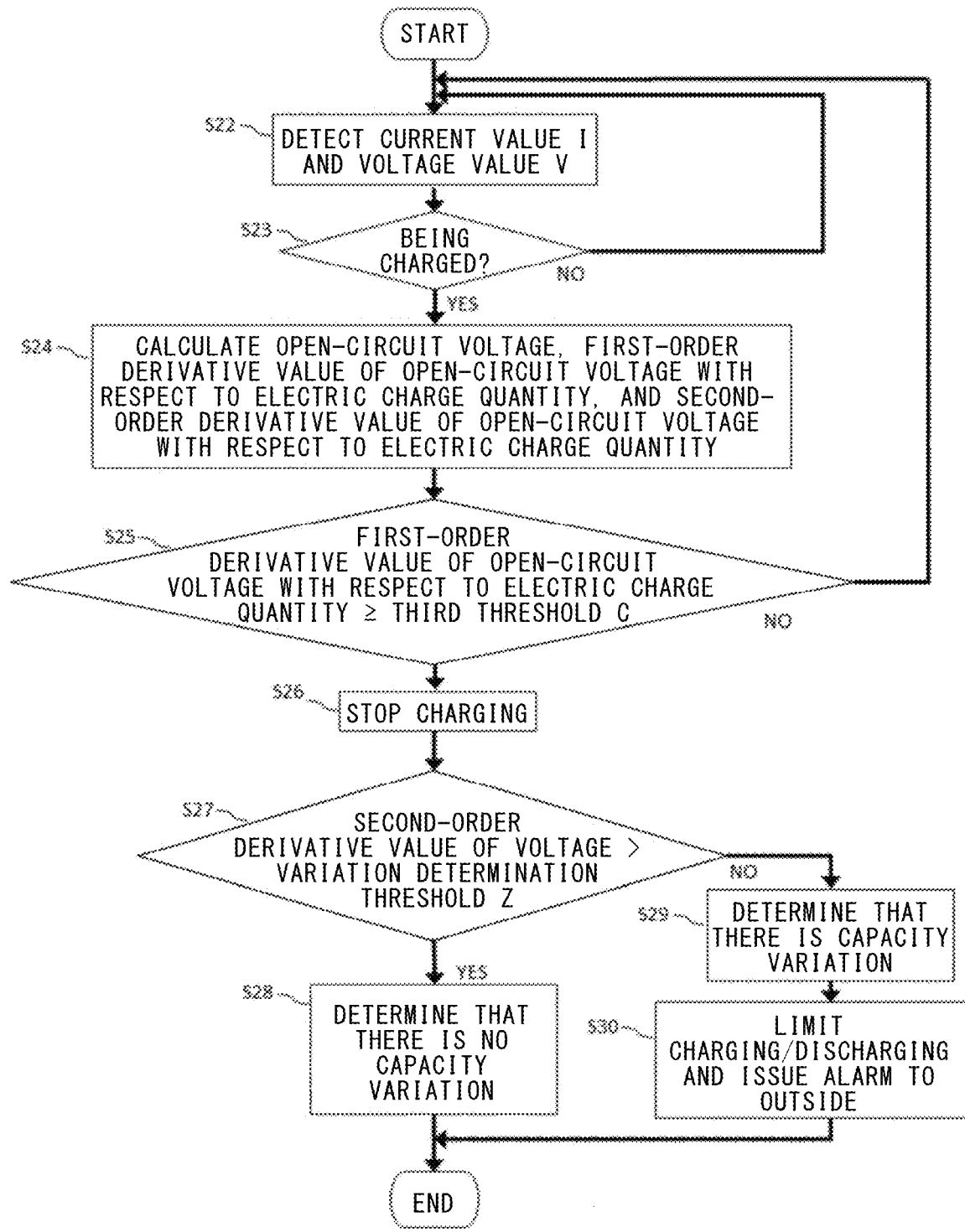
FIG. 7 is a control flowchart of a charging/discharging control device according to embodiment 3 of the present invention.

FIG. 7 is a capacity variation determination flowchart executed by the charging/discharging control device according to embodiment 3 of the present invention. This flowchart is repeatedly executed at certain time intervals during operation of the charging/discharging control unit 2, to detect capacity variation among the storage battery cells. Hereinafter, with reference to the flowchart in FIG. 7, a charging/discharging control method according to embodiment 3 will be described. It is noted that operation for calculating the resistance value by the resistance value estimation unit 5 is the same as operation by the resistance value estimation unit 5 according to embodiment 1.

In FIG. 7, when operation of the charging/discharging control unit 2 is started, in step S22, the current sensor 4 connected in series to the assembled battery 10 measures the current value I of current flowing through the assembled battery 10, and the voltage sensor 3 connected in parallel to the assembled battery 10 measures the voltage value V of the assembled battery 10. The measured current value I and voltage value V are outputted to the charging/discharging control unit 2 and then stored in the storage unit 7.

In step S23, the charging/discharging control unit 2 determines whether or not the assembled battery 10 is being charged, on the basis of the measurement result of the current sensor 4. For example, if the current value I in the charging direction is detected, it is determined that charging is being performed. If it is determined that the assembled battery 10 is not being charged, the process returns to the first step S22. If it is determined that the assembled battery 10 is being charged, the process proceeds to step S24.

In step S24, the calculation unit 6 calculates the open-circuit voltage OCV of the assembled battery, using the above Expression (2) in which a value obtained by multiplying the current value I measured by the current sensor 4 by the assembled battery resistance value R estimated by the resistance value estimation unit 5 is subtracted from the voltage value V of the assembled battery 10 measured by the voltage sensor 3.

Through calculation of the open-circuit voltage OCV by Expression (2), even when the current value I has changed during charging, error is corrected by subtraction of a product of the current value I and the assembled battery resistance value R, whereby the open-circuit voltage OCV can be accurately calculated. The process thus far is the same as the control process in embodiment 1.

In addition, the calculation unit 6 calculates a voltage first-order derivative value which is a value obtained through first-order differentiation of the open-circuit voltage OCV with respect to the electric charge quantity Q by Expression (5), and performs second-order differentiation of the open-circuit voltage OCV with respect to the electric charge quantity Q as the electric-charge-quantity corresponding value by the above Expression (3), to calculate the voltage second-order derivative value. Here, the electric charge quantity Q is an example of the electric-charge-quantity corresponding value. Instead of the electric charge quantity Q, the remaining capacity SOC may be used as the electric-charge-quantity corresponding value.

[Mathematical 5]

$$\text{Voltage first-order derivative value} = \frac{d(OCV)}{dQ} \quad (5)$$

The storage unit 7 stores the open-circuit voltage OCV, the value obtained through first-order differentiation of the open-circuit voltage OCV with respect to the electric charge quantity Q, and the voltage second-order derivative value. In the calculation unit 6, measurement error included in the measured values may be corrected using a low-pass filter or the like.

Figure 8:
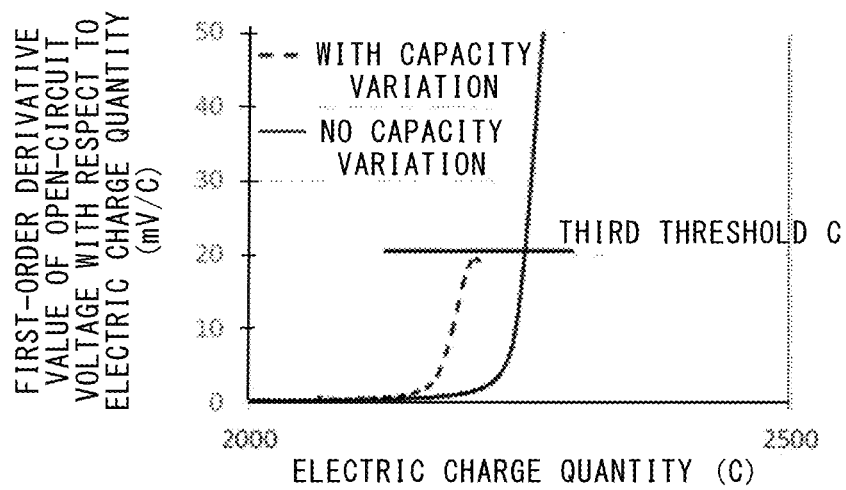
FIG. 8 is a graph showing an example of a value obtained through first-order differentiation of open-circuit voltage with respect to an electric charge quantity when an assembled battery including storage batteries connected in series is charged.

In the next step S25, the charging/discharging control unit 2 compares the calculated voltage first-order derivative value with a third threshold C, to determine whether or not the charging is completed. Here, the third threshold C is set to be the maximum value of a value obtained through first-order differentiation of the open-circuit voltage in a normal usage state prescribed in shipping for the single storage battery with respect to the electric charge quantity which is the electric-charge-quantity corresponding value, for example. The third threshold C may be determined using another method. A lithium ion battery using lithium iron phosphate as a main component of a positive electrode or using lithium titanate as a main component of a negative electrode has such a characteristic that the voltage value of the storage battery sharply increases at the end stage of charging. Therefore, it is possible to perform determination for the charging-stop condition by comparing the third threshold C with the value obtained through first-order differentiation of the open-circuit voltage V with respect to the electric charge quantity Q. FIG. 8 shows the value obtained through first-order differentiation of the open-circuit voltage with respect to the electric charge quantity when the series-connected assembled battery is charged. The voltage increase state of the storage battery cell reduced in capacity can be determined using the value obtained through first-order differentiation of the open-circuit voltage with respect to the electric charge quantity.

If the value obtained through first-order differentiation of the open-circuit voltage with respect to the electric charge quantity is smaller than the third threshold C, i.e., the value obtained through first-order differentiation of the open-circuit voltage with respect to the electric charge quantity<C is satisfied, the process returns to step S22, to continue the charging. On the other hand, when the value obtained through first-order differentiation of the open-circuit voltage with respect to the electric charge quantity is equal to or greater than the third threshold C, the charging-stop condition is satisfied. That is, if the value obtained through first-order differentiation of the open-circuit voltage with respect to the electric charge quantity C is satisfied, the charging/discharging control unit 2 determines that the charging-stop condition is satisfied, and thus proceeds to step S26, to stop the charging.

In the next step S27, whether or not there is capacity variation among the plurality of storage batteries 1 in the assembled battery 10 is determined on the basis of the voltage second-order derivative value when the charging-stop condition is satisfied. The charging/discharging control unit 2 compares the variation determination threshold Z with the voltage second-order derivative value which is the value obtained through second-order differentiation of the open-circuit voltage OCV with respect to the electric charge quantity Q. As the variation determination threshold Z, for example, the maximum value of the value obtained through second-order differentiation of the open-circuit voltage of the single storage battery with respect to the electric charge quantity is used, as in embodiment 1. Alternatively, the variation determination threshold Z may be determined by a battery setting reference or the like in manufacturing of the storage batteries and this determined value stored in the storage device may be used.

If the value obtained through second-order differentiation of the open-circuit voltage OCV with respect to the electric charge quantity Q is greater than the variation determination threshold Z, i.e., the voltage second-order derivative value>Z is satisfied, in step S28, it is determined that there is no capacity variation among the storage battery cells in the assembled battery 10, and thus the capacity variation determination flowchart is ended.

If the value obtained through second-order differentiation of the open-circuit voltage OCV with respect to the electric charge quantity Q is equal to or smaller than the variation determination threshold Z, i.e., the voltage second-order derivative value≤Z is satisfied, in step S29, it is determined that there is capacity variation among the storage battery cells in the assembled battery 10. Next, in step S30, the charging/discharging control unit 2 performs at least one of limitation of charging/discharging and alarm to the outside by the alarm unit 8. As used herein, limitation of charging/discharging refers to lowering the upper-limit voltage when charging is performed again, raising the lower-limit voltage when discharging is performed, or lowering the maximum current value when charging/discharging is performed, for example.

The charging/discharging control device and the charging/discharging control method according to embodiment 3 can detect capacity variation among the storage battery cells connected in series, as in embodiment 1.

In addition, even if there is capacity variation in the assembled battery, comparison between the third threshold C and the value obtained through first-order differentiation of the open-circuit voltage of the assembled battery with respect to the electric charge quantity is used for the determination condition for stopping charging, whereby presence of the storage battery cell reduced in capacity can be detected and the storage battery cell reduced in capacity can be prevented from being overcharged.

Embodiment 4

Figure 9:
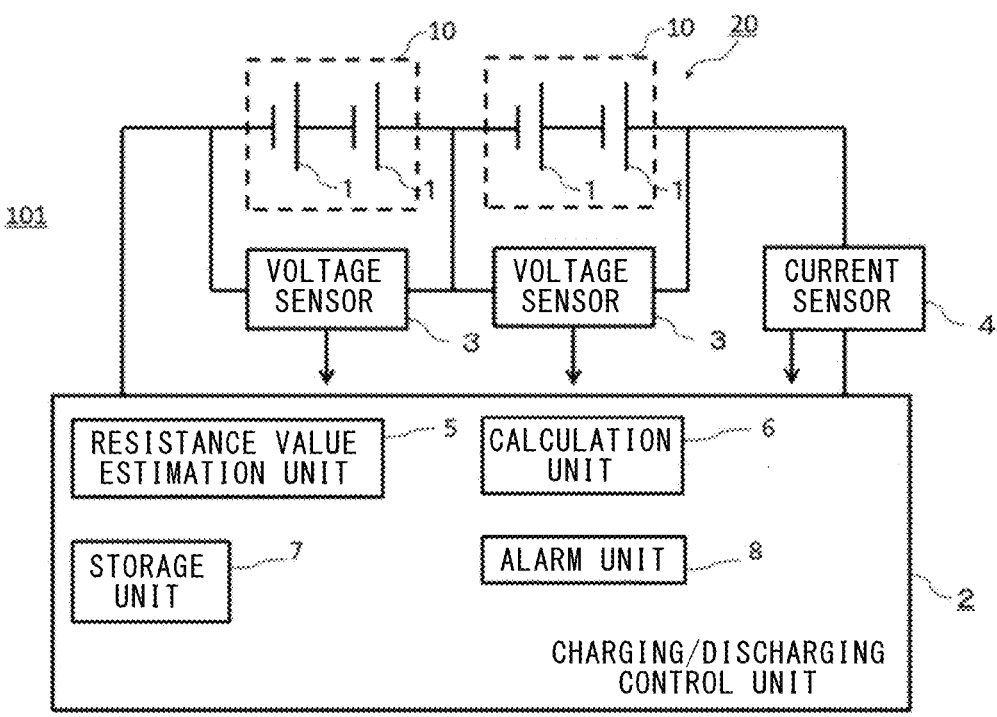
FIG. 9 is a diagram illustrating the configuration of a charging/discharging control device according to embodiment 4 of the present invention.

FIG. 9 is a configuration diagram of a charging/discharging control device according to embodiment 4. In embodiment 4, the same components as in embodiment 1 are denoted by the same reference characters, and description of the same or corresponding parts is omitted.

FIG. 9 shows a charging/discharging control device 101 according to embodiment 4, which controls charging/discharging of an assembled-battery group 20 formed by connecting, in series, a plurality of assembled batteries 10 each including a plurality of storage batteries 1 connected in series in the same module pack. The charging/discharging control device 101 includes the voltage sensors 3 respectively connected in parallel to the plurality of assembled batteries 10, the current sensor 4 connected in series to the assembled-battery group 20, and the charging/discharging control unit 2. The basic configuration of the charging/discharging control unit 2 in the charging/discharging control device 101 according to embodiment 4 is the same as that of the charging/discharging control unit 2 in the charging/discharging control device 100 according to embodiment 1 shown in FIG. 1. The current value of the assembled-battery group 20 including the plurality of assembled batteries 10 connected in series is the same as the current value of each assembled battery 10.

Also for the charging/discharging control device 101 according to embodiment 4, the charging/discharging control methods according to embodiments 1 to 3 can be applied. As in the charging/discharging control methods according to embodiments 1 to 3, first, in a certain period, an assembled battery resistance value R(M) of each assembled battery 10 is calculated using Expression (6) corresponding to Expression (1) and then stored in the storage unit 7, in accordance with the resistance value calculation flowchart showing operation of the resistance value estimation unit 5 in FIG. 2. Here, M is the number of the assembled batteries 10.
[Mathematical 6]

$$R(M)=[V(M)_2-V(M)_1]/(I_1-I_2) \quad (6)$$

Here, $I_1$ is the current value before the current value changes, $I_2$ is the current value after the current value has changed, $V(M)_1$ is the voltage value of the corresponding assembled battery before the current value changes, and $V(M)_2$ is the voltage value of the corresponding assembled battery after the current value has changed. The calculated assembled battery resistance value R(M) of each assembled battery is stored in the storage unit 7. Expression (6) is an example of a calculation method for the assembled battery resistance value. Another known estimation method for the resistance value may be used.

Next, a charging/discharging control method according to embodiment 4 can also be performed sequentially in accordance with the capacity variation determination flowchart in embodiment 1 shown in FIG. 3, for example.

In FIG. 3, when operation of the charging/discharging control unit 2 is started, the process proceeds to step S04. In step S04, the current sensor 4 measures the current value I of current flowing through the assembled-battery group 20, and the voltage sensor 3 measures the voltage value V(M) of each assembled battery 10. These values are outputted to the charging/discharging control unit 2 and then stored in the storage unit 7.

In step S05, the charging/discharging control unit 2 determines whether or not the assembled-battery group 20 is being charged, on the basis of the measurement result of the current sensor 4. If the current value I in the charging direction is detected, it is determined that charging is being performed. If it is determined that the assembled-battery group 20 is not being charged, the process returns to the first step S04. If it is determined that the assembled-battery group 20 is being charged, the process proceeds to step S06.

In step S06, the calculation unit 6 calculates open-circuit voltage OCV(M) of each assembled battery 10, using Expression (7) corresponding to the above Expression (2).
[Mathematical 7]

$$OCV(M)=V(M)-[I \times R(M)] \quad (7)$$

That is, the open-circuit voltage OCV(M) is calculated by subtracting, from the voltage value V(M) of each assembled battery 10 measured by each voltage sensor 3, a value obtained by multiplying the current value I measured by the current sensor 4 by each assembled battery resistance value R(M) estimated by the resistance value estimation unit 5.

In addition, the calculation unit 6 calculates, as a voltage second-order derivative value, a value obtained through second-order differentiation of the open-circuit voltage OCV(M) of each assembled battery 10 with respect to the electric charge quantity Q as the electric-charge-quantity corresponding value by Expression (8) corresponding to the above Expression (3). Here, the electric charge quantity Q represents the quantity of electric charge as an electric-charge-quantity corresponding value, and is obtained by integrating the current value I with respect to time. The electric charge quantity Q is an example of the electric-charge-quantity corresponding value. Instead of the electric charge quantity Q, the remaining capacity SOC may be used as the electric-charge-quantity corresponding value.

[Mathematical 8]

$$\text{Voltage second-order derivative value} = \frac{d^2(OCV(M))}{dQ^2} \quad (8)$$

The storage unit 7 stores the value obtained through second-order differentiation of the open-circuit voltage OCV(M) of each assembled battery with respect to the electric charge quantity Q. In the calculation unit 6, measurement error included in the measured values may be corrected using a low-pass filter or the like.

In the next step S07, the charging/discharging control unit 2 compares the voltage V(M) of each assembled battery 10 with the first threshold A, to determine whether or not the charging is completed. The first threshold A is, for example, determined by the above Expression (4) using N which is the number of the storage batteries 1 connected in series in each assembled battery and full-charge voltage Vmax for the single storage battery.

If the voltages V(M) of all the assembled batteries 10 are smaller than the first threshold A, i.e., V(M)<A is satisfied, the process returns to step S04, to continue the charging. On the other hand, when the voltage V(M) of at least one assembled battery 10 is equal to or greater than the first threshold A, a charging-stop condition is satisfied. That is, if V(M)≥A is satisfied, the charging/discharging control unit 2 determines that the charging-stop condition is satisfied, and thus proceeds to step S08, to stop the charging.

In the next step S09, whether or not there is capacity variation among the plurality of storage batteries 1 in each assembled battery 10 is determined on the basis of each voltage second-order derivative value when the charging-stop condition is satisfied. The charging/discharging control unit 2 compares the variation determination threshold Z with the value obtained through second-order differentiation of the open-circuit voltage OCV(M) of each assembled battery with respect to the electric charge quantity Q. As the variation determination threshold Z, for example, the maximum value of the value obtained through second-order differentiation of the open-circuit voltage of the single storage battery with respect to the electric charge quantity is used. Alternatively, the variation determination threshold Z may be determined by a battery setting reference or the like in manufacturing of the storage batteries and this determined value stored in the storage device may be used.

If the value obtained through second-order differentiation of the open-circuit voltage OCV(M) of each assembled battery 10 with respect to the electric charge quantity Q is greater than the variation determination threshold Z, i.e., the voltage second-order derivative value of each assembled battery 10>the variation determination threshold Z is satisfied, in step S10, it is determined that there is no capacity variation among the storage battery cells in the assembled battery 10, and thus the process is ended. If there is any assembled battery 10 in which the value obtained through second-order differentiation of the open-circuit voltage OCV with respect to the electric charge quantity Q is equal to or smaller than the variation determination threshold Z, i.e., there is any assembled battery 10 for which the voltage second-order derivative value≤Z is satisfied, in step S1*l*, it is determined that there is capacity variation among the storage battery cells in the assembled battery 10, and in step S12, the charging/discharging control unit 2 performs at least one of limitation of charging/discharging and alarm to the outside by the alarm unit 8. As used herein, limitation of charging/discharging refers to lowering the upper-limit voltage when charging is performed again, raising the lower-limit voltage when discharging is performed, or lowering the maximum current value when charging/discharging is performed, for example.

The charging/discharging control device and the charging/discharging control method according to embodiment 4 can detect capacity variation among the storage battery cells in each of the assembled batteries connected in series in the assembled-battery group.

Embodiment 5

Figure 10:
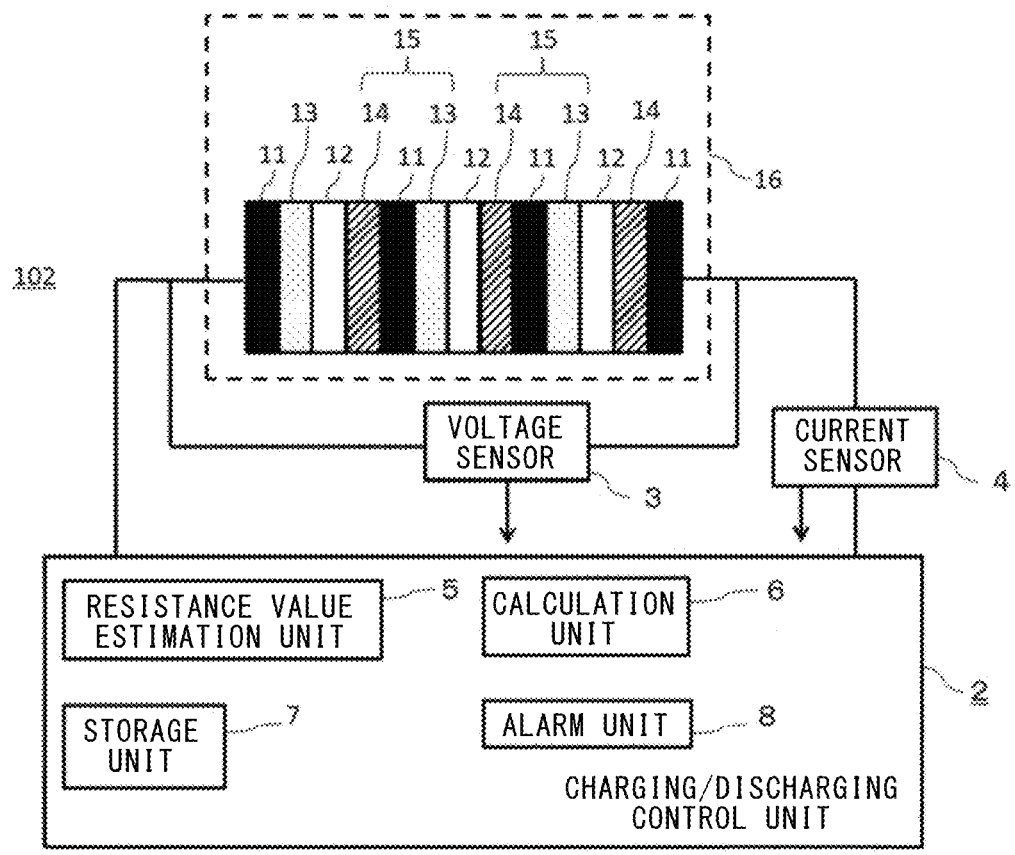
FIG. 10 is a diagram illustrating the configuration of a charging/discharging control device according to embodiment 5 of the present invention.

FIG. 10 is a configuration diagram of a charging/discharging control device according to embodiment 5. In embodiment 5, the same components as in embodiment 1 are denoted by the same reference characters, and description of the same or corresponding parts is omitted.

A charging/discharging control device 102 and a charging/discharging control method according to embodiment 5 can be applied to a bipolar battery. The basic configuration of the charging/discharging control device 102 according to embodiment 5 is the same as that of the charging/discharging control device 100 according to embodiment 1 shown in FIG. 1.

As shown in FIG. 10, a bipolar battery 16 has a structure in which bipolar stacked electrodes 15 each formed by arranging a positive electrode material 13 and a negative electrode material 14 on the front and back sides of a current collector 11 in a stacked manner are connected in series with separators 12 interposed therebetween. One bipolar battery 16 formed by a plurality of bipolar stacked electrodes 15 can be regarded as an assembled battery including a plurality of storage batteries connected in series. That is, the storage battery in embodiment 1 corresponds to each bipolar stacked electrode, and the assembled battery corresponds to the bipolar battery including the plurality of bipolar stacked electrodes connected in series. Also for the bipolar battery 16, whether or not there is capacity variation among the bipolar stacked electrodes 15 can be determined and the electrode reduced in capacitance can be detected by the charging/discharging control methods according to embodiments 1 to 3.

The charging/discharging control device and the charging/discharging control method according to embodiment 5 can detect capacity variation among the bipolar stacked electrodes in the bipolar battery.

Figure 11:
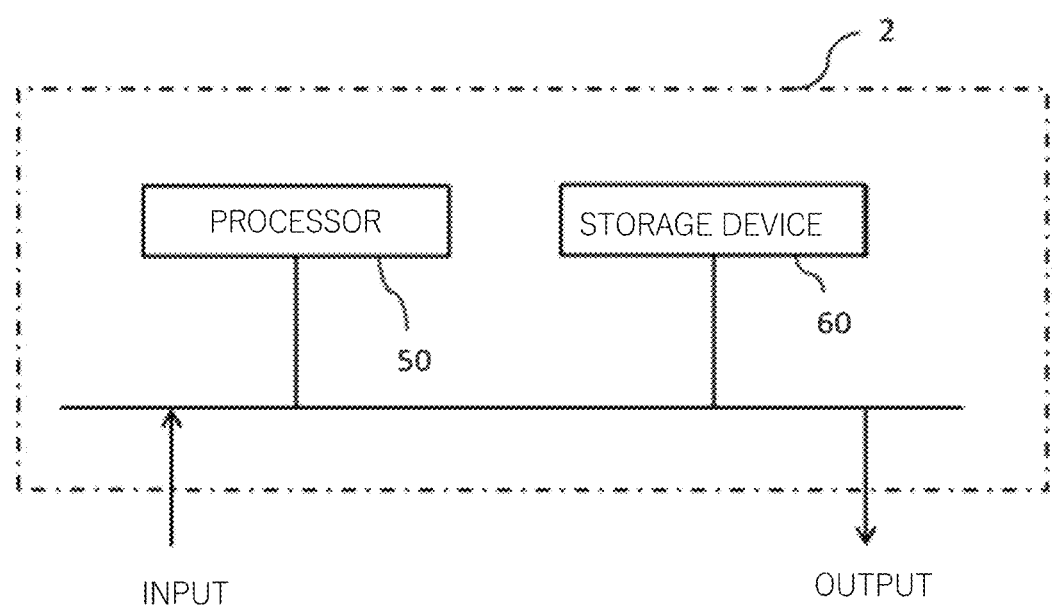
FIG. 11 is an example of hardware of the charging/discharging control unit.

FIG. 11 shows an example of hardware of the charging/discharging control unit 2. This is composed of a processor 50 and a storage device 60. Although not shown, the storage device 60 includes a volatile storage device such as a Random-Access Memory, and a nonvolatile auxiliary storage device such as a flash memory. Instead of the flash memory, an auxiliary storage device of a hard disk may be provided. The processor 50 executes a program inputted from the storage device 60, thereby executing operation flowcharts explained in the embodiment 1 to 5. In this case, the program is inputted to the processor 50 via the volatile storage device from the auxiliary storage device. In addition, the processor 50 may output data such as a calculation result to the volatile storage device of the storage device 60, or may store the data into the auxiliary storage device via the volatile storage device.

DESCRIPTION OF THE REFERENCE CHARACTERS

1 storage battery
2 charging/discharging control unit
3 voltage sensor
4 current sensor
5 resistance value estimation unit
6 calculation unit
7 storage unit
8 alarm unit
10 assembled battery
11 current collector
12 separator
13 positive electrode material
14 negative electrode material
15 bipolar stacked electrode
16 bipolar battery
20 assembled-battery group
100, 101, 102 charging/discharging control device

The invention claimed is:

1. A charging/discharging control device for controlling charging/discharging of an assembled battery including a plurality of storage batteries connected in series, the charging/discharging control device comprising a charging/discharging controller which calculates an electric-charge-quantity corresponding value which is a value corresponding to an electric charge quantity of the assembled battery, on the basis of a current value of the assembled battery, and calculates, as a voltage second-order derivative value, a value obtained through second-order differentiation of open-circuit voltage of the assembled battery with respect to the electric-charge-quantity corresponding value, wherein when a predetermined charging-stop condition is satisfied, the charging/discharging controller performs control to stop charging, and determines whether or not there is capacity variation among the plurality of storage batteries in the assembled battery, on the basis of the voltage second-order derivative value when the charging-stop condition is satisfied.

2. The charging/discharging control device according to claim 1, wherein each storage battery corresponds to a bipolar stacked electrode, the assembled battery corresponds to a bipolar battery including a plurality of the bipolar stacked electrodes connected in series, and whether or not there is capacity variation among the bipolar stacked electrodes in the bipolar battery is determined on the basis of the voltage second-order derivative value.

3. The charging/discharging control device according to claim 1, wherein a maximum value of a value obtained through second-order differentiation of the open-circuit voltage of the single storage battery with respect to the electric-charge-quantity corresponding value is used as a capacity variation determination threshold, and when the voltage second-order derivative value is equal to or smaller than the capacity variation determination threshold, the charging/discharging controller determines that there is the capacity variation among the plurality of storage batteries.

4. The charging/discharging control device according to claim 1, further comprising:

a voltage sensor for measuring a voltage value of the assembled battery; and a current sensor for measuring a current value of the assembled battery.

5. The charging/discharging control device according to claim 4, wherein the charging/discharging controller includes a resistance value estimator for estimating an assembled battery resistance value of the assembled battery from change in the voltage value with respect to change in the current value.

6. The charging/discharging control device according to claim 5, wherein the charging/discharging controller calculates the open-circuit voltage of the assembled battery by subtracting, from the voltage value, a value obtained by multiplying the current value by the assembled battery resistance value.

7. The charging/discharging control device according to claim 4, wherein a product of a number of the storage batteries connected in series and full-charge voltage for the single storage battery is used as a first threshold, and when the voltage value is equal to or greater than the first threshold, the charging-stop condition is satisfied, so that control is performed to stop charging.

8. The charging/discharging control device according to claim 1, wherein when the charging/discharging controller has determined that there is the capacity variation, at least one of limitation of charging/discharging of the assembled battery and alarm to outside indicating that there is the capacity variation, is performed.

9. The charging/discharging control device according to claim 1, wherein when change in the voltage second-order derivative value in accordance with a calculation time shifts from increase to decrease, the charging-stop condition is satisfied, so that control is performed to stop charging.

10. The charging/discharging control device according to claim 1, wherein a value obtained through first-order differentiation of the open-circuit voltage of the assembled battery with respect to the electric-charge-quantity corresponding value is calculated as a voltage first-order derivative value, a maximum value of a value obtained through first-order differentiation of open-circuit voltage in a normal usage state prescribed in shipping for the single storage battery with respect to the electric charge quantity which is the electric-charge-quantity corresponding value, is used as a third threshold, and when the voltage first-order derivative value is equal to or greater than the third threshold, the charging-stop condition is satisfied, so that control is performed to stop charging.

11. The charging/discharging control device according to claim 1, wherein each storage battery is a lithium ion battery.

12. A charging/discharging control device for controlling charging/discharging of an assembled-battery group formed by connecting, in series, a plurality of assembled batteries each including a plurality of storage batteries connected in series, the charging/discharging control device comprising a charging/discharging controller which calculates an electric-charge-quantity corresponding value which is a value corresponding to an electric charge quantity of the assembled battery, on the basis of a current value of the assembled battery, and calculates, as a voltage second-order derivative value, a value obtained through second-order differentiation of open-circuit voltage of each assembled battery with respect to the electric-charge-quantity corresponding value, wherein when a predetermined charging-stop condition is satisfied, the charging/discharging controller performs control to stop charging, and determines whether or not there is capacity variation among the plurality of storage batteries in each assembled battery, on the basis of each voltage second-order derivative value when the charging-stop condition is satisfied.

13. A charging/discharging control method for controlling charging/discharging of an assembled battery including a plurality of storage batteries connected in series, the charging/discharging control method comprising the steps of:

measuring a voltage value of the assembled battery;

measuring a current value of the assembled battery;

estimating an assembled battery resistance value of the assembled battery from change in the voltage value with respect to change in the current value;

calculating an electric-charge-quantity corresponding value which is a value corresponding to an electric charge quantity of the assembled battery, from the current value;

calculating, as a voltage second-order derivative value, a value obtained through second-order differentiation of open-circuit voltage of the assembled battery with respect to the electric-charge-quantity corresponding value; and when a predetermined charging-stop condition is satisfied, performing control to stop charging, and determining whether or not there is capacity variation among the plurality of storage batteries in the assembled battery, on the basis of the voltage second-order derivative value when the charging-stop condition is satisfied.

14. The charging/discharging control method according to claim 13, wherein each storage battery corresponds to a bipolar stacked electrode, and the assembled battery corresponds to a bipolar battery including a plurality of the bipolar stacked electrodes connected in series, the charging/discharging control method comprising the step of determining whether or not there is capacity variation among the bipolar stacked electrodes in the bipolar battery, on the basis of the voltage second-order derivative value.

15. The charging/discharging control method according to claim 13, wherein a maximum value of a value obtained through second-order differentiation of the open-circuit voltage of the single storage battery with respect to the electric-charge-quantity corresponding value is used as a capacity variation determination threshold, and when the voltage second-order derivative value is equal to or smaller than the capacity variation determination threshold, it is determined that there is the capacity variation among the plurality of storage batteries.

\* \* \* \* \*